United States Patent
Hsu et al.

(10) Patent No.: US 8,386,969 B2
(45) Date of Patent: Feb. 26, 2013

(54) METHOD FOR DESIGNING OVERLAY TARGETS AND METHOD AND SYSTEM FOR MEASURING OVERLAY ERROR USING THE SAME

(75) Inventors: Wei Te Hsu, Taipei County (TW); Yi Sha Ku, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 5 days.

(21) Appl. No.: 13/225,690

(22) Filed: Sep. 6, 2011

(65) Prior Publication Data

US 2011/0320986 A1    Dec. 29, 2011

Related U.S. Application Data

(62) Division of application No. 12/207,896, filed on Sep. 10, 2008.

(30) Foreign Application Priority Data

Jun. 13, 2008 (TW) ............................. 97122076 A (51) Int. Cl.
*G06F 17/50* (2006.01)
(52) U.S. Cl. ............................. 716/54; 716/51
(58) Field of Classification Search ............ 716/51, 716/54
See application file for complete search history.

(56) References Cited

U.S. PATENT DOCUMENTS

2007/0229829 A1*  10/2007  Kandel et al. ................ 356/401

FOREIGN PATENT DOCUMENTS

TW          200622351          7/2006

OTHER PUBLICATIONS

Taiwan Office Action dated Nov. 2, 2011 for Taiwan application 097122076, which is the corresponding Taiwan application for the present application which cites Taiwan publication 200622351 (application 093141298).

* cited by examiner

*Primary Examiner* — Suresh Memula
(74) *Attorney, Agent, or Firm* — WPAT, P.C.; Anthony King (57) ABSTRACT

A method for designing an overlay target comprises selecting a plurality of overlay target pairs having different overlay errors or offsets, calculating a deviation of the simulated diffraction spectrum for each overlay target pair, selecting a plurality of sensitive overlay target pairs by taking the deviation of the simulated diffraction spectrum into consideration, selecting an objective overlay target pair from the sensitive overlay target pairs by taking the influence of the structural parameters to the simulated diffraction spectrum into consideration, and designing the overlay target pair based on the structural parameter of the objective overlay target pair.

17 Claims, 9 Drawing Sheets

METHOD FOR DESIGNING OVERLAY TARGETS AND METHOD AND SYSTEM FOR MEASURING OVERLAY ERROR USING THE SAME

BACKGROUND OF THE INVENTION

1. Field of the Invention

The present invention relates generally to a system and method for measuring an overlay error, and more particularly, to a method for measuring an overlay error by matching the deviations of the diffraction spectrum of overlay target pairs.

2. Description of the Related Art

Continuing improvements in semiconductor process technology have increased the accuracy required for overlay measurement. According to the ITRS (International Technology Roadmap for Semiconductor) the overlay tolerance in the semiconductor process is about one-sixth of line width, and the corresponding metrology error budget is only about one-sixtieth of line width. Therefore, due to diffraction limitations and proximity effects, image-based overlay metrology cannot fulfill the accuracy requirements for the next-generation structural parameter measurement. Diffraction-based metrology, which is different from image-based overlay metrology and is not influenced by the proximity effects, has high repeatability and reproducibility characteristics and will become an important overlay measurement technology. An overlay measurement system using diffraction-based metrology technology is comprised of a scatterometer and a program for matching analysis, and the analysis technique can be a theoretical model-based method or an empirical model-based method. The spectrum of the theoretical model-based method is calculated using a theory such as RCWT (Rigorous Coupled Wave Theory) or FDTD (Finite Difference Time Domain) and is compared with a measured spectrum to find the overlay error. In practice, the parameters such as line widths, thickness, sidewall angles, and overlay errors are typically strongly correlated, and any incorrect parameter will result in incorrect overlay calculation.

The empirical model-based method compares measured data with an empirical regression line, which approximates the data obtained and analysed by measuring the diffraction spectrum formed by a series of (at least four) gratings having different overlay deviation patterns. These gratings are fabricated on a wafer. The advantage of this method is that it does not require a lot of simulations for setting up a matching library, and therefore there is no strong correlation problem between the parameters. However, one disadvantage of this method is that many gratings must be fabricated and measured on a semiconductor wafer for gathering the library data, which requires a lot of time.

SUMMARY OF THE INVENTION

One aspect of the present invention provides a method for designing an overlay target, and method and system for measuring an overlay error. In one aspect, the present invention can eliminate strong correlation problems among structural parameters. In another aspect, the present invention can generate enough theoretical model-based data to reduce the work of fabricating overlay targets on a semiconductor wafer and measuring the diffraction spectrum formed by the gratings.

A method for designing an overlay target according to this aspect of the present invention comprises selecting a plurality of overlay target pairs having different overlay errors or offsets, calculating a deviation of the simulated diffraction spectrum for each overlay target pair, selecting a plurality of sensitive overlay target pairs by taking the deviation of the simulated diffraction spectrum into consideration, selecting an objective overlay target pair from the sensitive overlay target pairs by taking the influence of the structural parameters to the simulated diffraction spectrum into consideration, and designing the overlay target pair based on the structural parameter of the objective overlay target pair.

Another aspect of the present invention provides a method for measuring an overlay error comprises measuring a diffraction spectrum of an overlay target pair, calculating a deviation of the measured diffraction spectrum of the overlay target pair, performing a matching process to search a matched deviation in a library, wherein the library stores a plurality of the deviations of the simulated diffraction spectra and corresponding overlay errors thereof, and determining the overlay error of the overlay target pair by taking the matched deviation into consideration.

Another aspect of the present invention provides a system for measuring an overlay error comprises an angular scatterometer configured to acquire a measured spectrum of an overlay target pair, a data processing module configured to calculate the deviation of the measured spectrum of the overlay target pair, a library unit configured to store the deviations of a plurality of simulated spectra and corresponding overlay errors thereof, and a match unit configured to compare the deviations of simulated diffraction spectra with the deviation of the measured diffraction spectrum of the overlay target pair so as to select an overlay error of the overlay target pair.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

One primary feature of the present invention is the application of the deviation of the simulated diffraction spectrum of an overlay target pair including two overlay targets. In one aspect, the present invention can eliminate strong correlation problems among structural parameters. In another aspect, the present invention can generate enough theoretical model-based data and reduce the work of fabricating overlay targets on a semiconductor wafer and measuring the diffraction spectrum formed by the overlay targets. Therefore, the present invention can have merits of both theoretical model-based methods and empirical model-based methods, and avoid the drawbacks of these methods.

Figure 1:
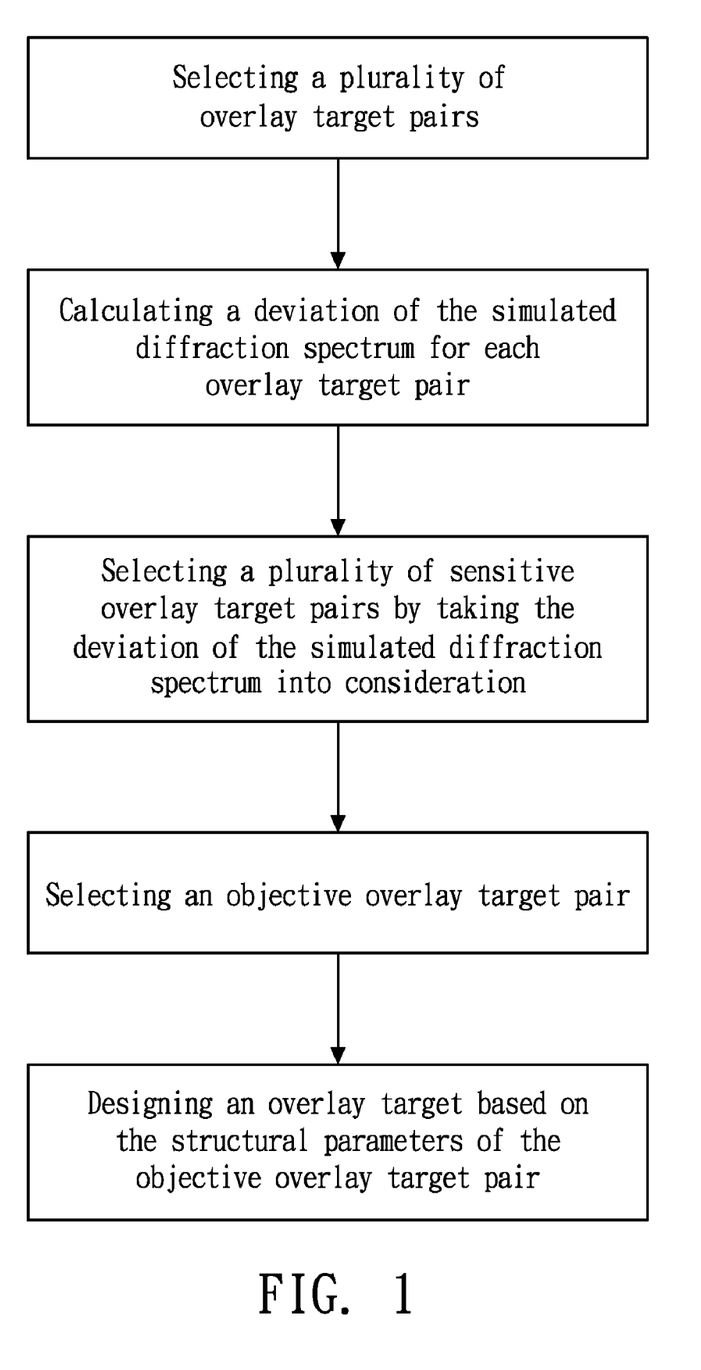
FIG. 1 shows a method for designing an overlay target according to one embodiment of the present invention.

FIG. 1 shows a method for designing an overlay target according to one embodiment of the present invention. The method initially selects a plurality of overlay target pairs having different overlay errors or offsets. The deviation of the simulated diffraction spectrum formed by each overlay target pair is then calculated. Next, a plurality of sensitive overlay target pairs are selected by taking the deviation of the simulated diffraction spectrum into consideration. Thereafter, an objective overlay target pair is selected from the sensitive overlay target pairs by taking the influence of structural parameters to the simulated diffraction spectrum into consideration. Finally, an overlay target pair is designed based on the structural parameters of the objective overlay target pair.

More detailed descriptions of the above steps are provided in FIG. 2-7. The method of the present invention, in summary, obtains the diffraction spectrum formed by an overlay target pair, then generates graphs of spectrum difference based on the overlay error, and finally sets up a match library for measuring overlay targets.

Figure 2A:
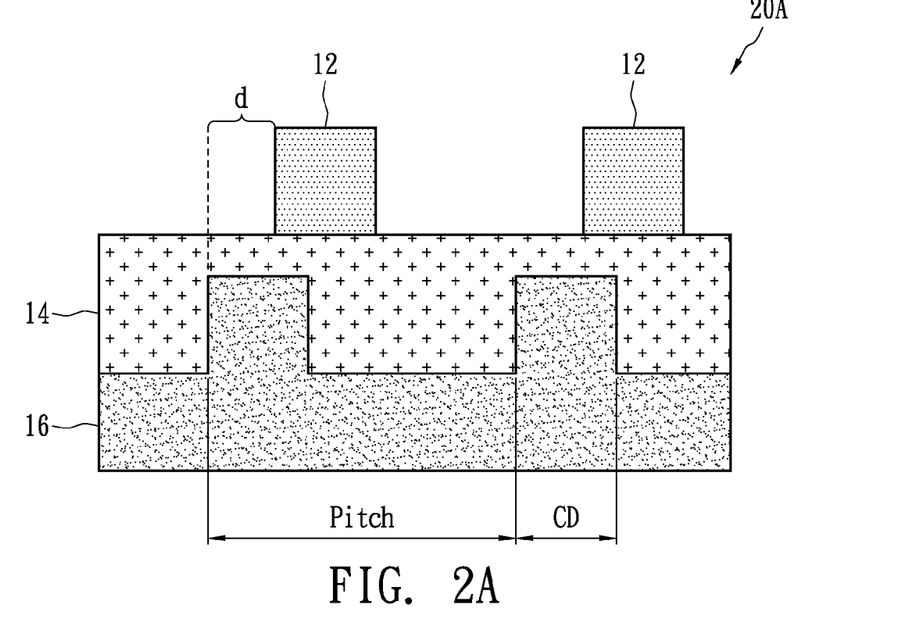
FIGS. 2A and 2B show an overlay target pair according to one embodiment of the present invention.
Figure 2B:
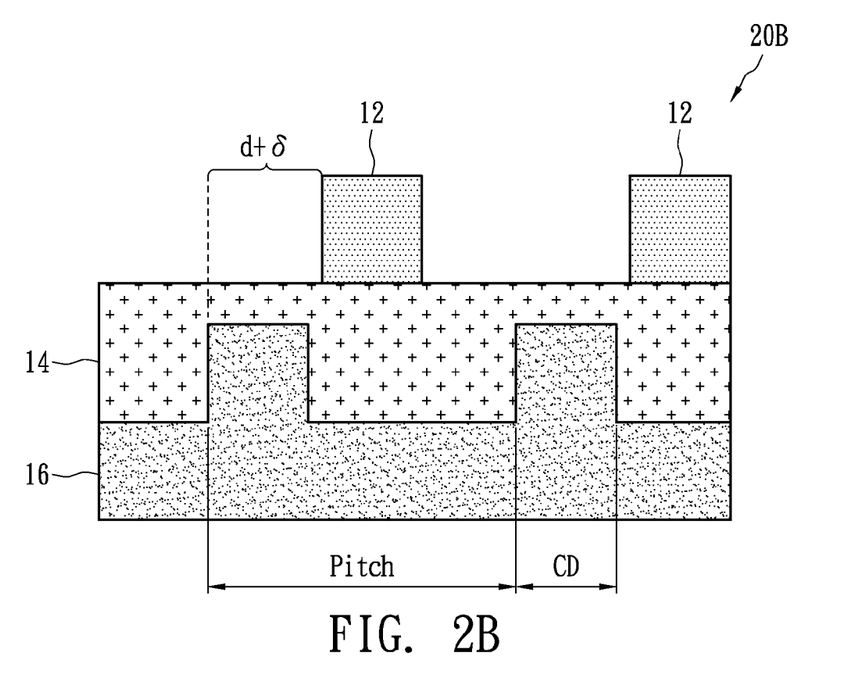

FIGS. 2A and 2B show an overlay target pair according to one embodiment of the present invention. The overlay target pair comprises two overlay targets 20A and 20B. Each overlay target 20A, 20B comprises an upper grating layer 12, a medium layer 14 and a lower grating layer 16. Both overlay targets 20A and 20B have the same structural parameters, but the overlay errors (d, d+δ) are different. For example, both overlay targets 20A and 20B have the same grating pitch, critical dimension line width and sidewall angle. However, the overlay target 20A has a predetermined overlay error (d), and the overlay target 20B has an overlay error, which is equal to the sum of the predetermined overlay error (d) and an offset (δ). Once the structural parameters, overlay error (d) and offset (δ) of an overlay target pair are determined, the spectrum of the overlay target pair can be simulated. For instance, the RCWT, a spectrum simulation algorithm, can be applied to simulate the diffraction spectrum of the overlay target pair.

Figure 3:
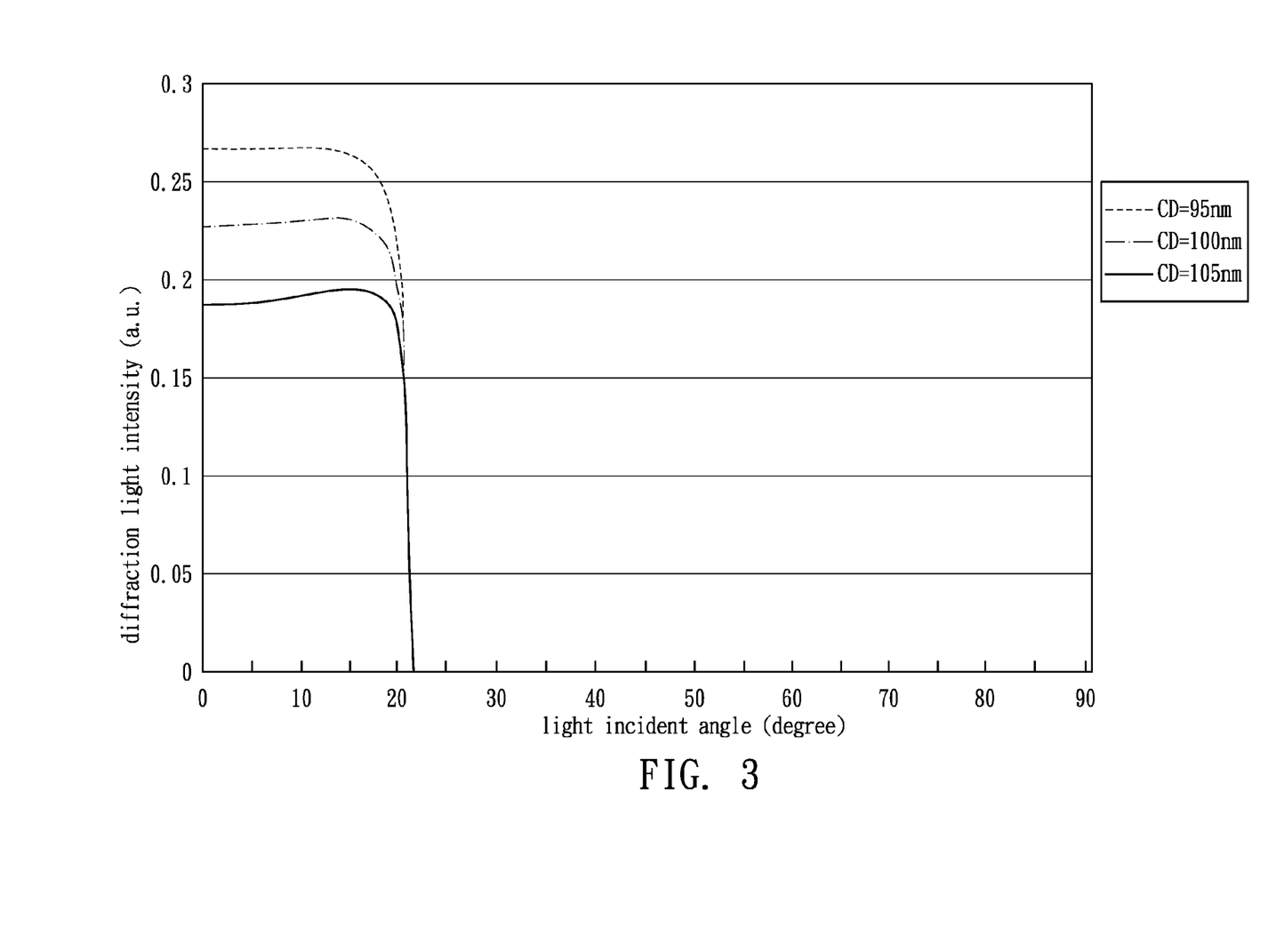
FIG. 3 shows a diagram of diffraction light intensity as a function of light incident angle for overlay targets with different line widths according to one embodiment of the present invention.

FIG. 3 shows a diagram of diffraction light intensity as a function of light incident angle for overlay targets with different line widths according to one embodiment of the present invention. The curves of FIG. 3 represent the diffraction light intensities of overlay targets, which have grating pitch of 300 nanometers (nm), line width of 100 nm, and overlay errors of 60, 57 and 90 nm. The horizontal axis shows the light incident angle, and the vertical axis shows the reflectance. The deviation of the diffraction spectrum of each overlay target pair can be calculated by performing difference method between the curve data at a certain angle value. The deviation can be mathematically written in functional notation as y=f(cd, sa, d, δ), wherein cd is line width, sa is sidewall angle, d is an overlay error, and δ is an offset in the overlay target pair. In some embodiments, the angle value can be the light incident angle with the highest level of diffraction intensity, and the deviation may be a difference value such as the root mean square (RMS) error.

Figure 4:
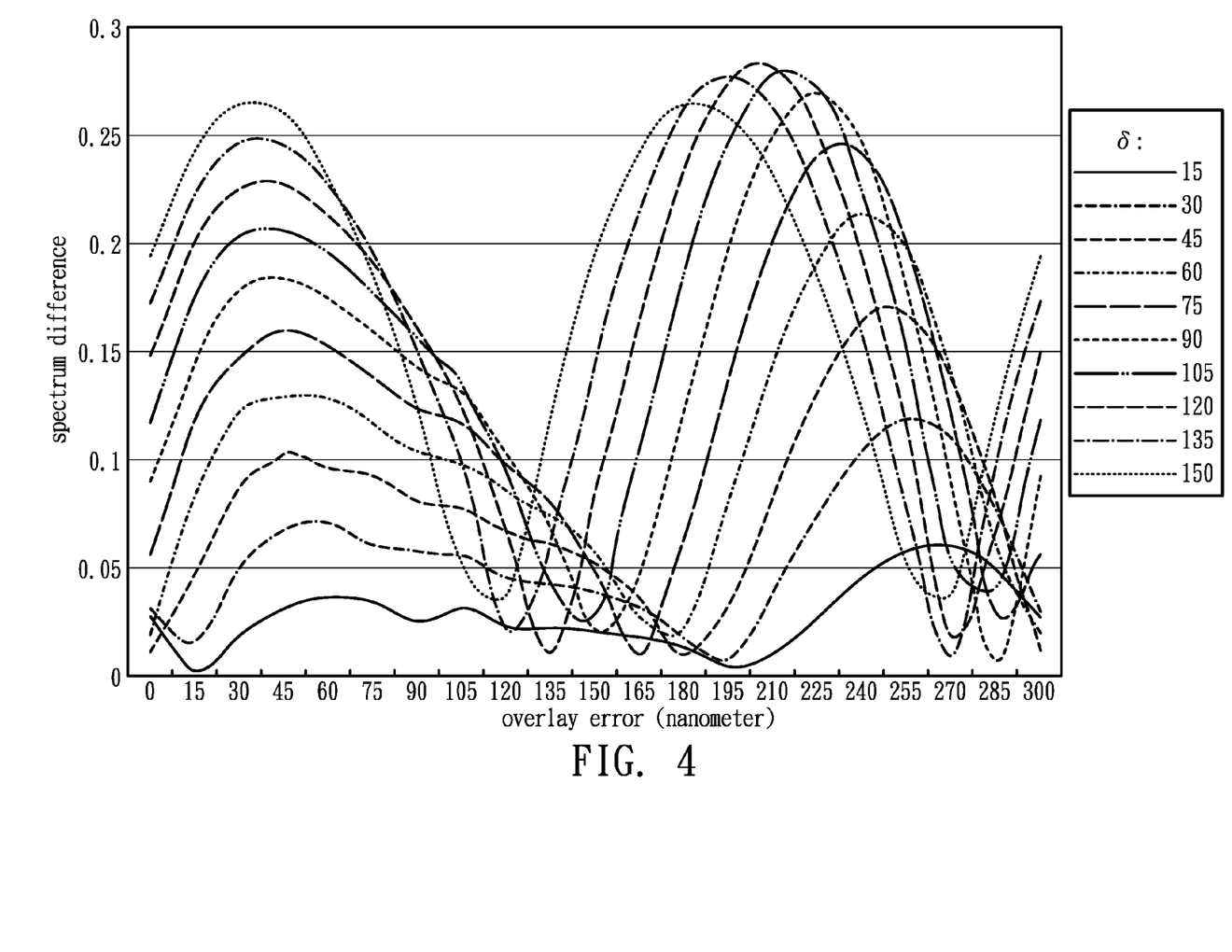
FIG. 4 shows a diagram of spectrum difference as a function of overlay error according to one embodiment of the present invention.
Figure 5A:
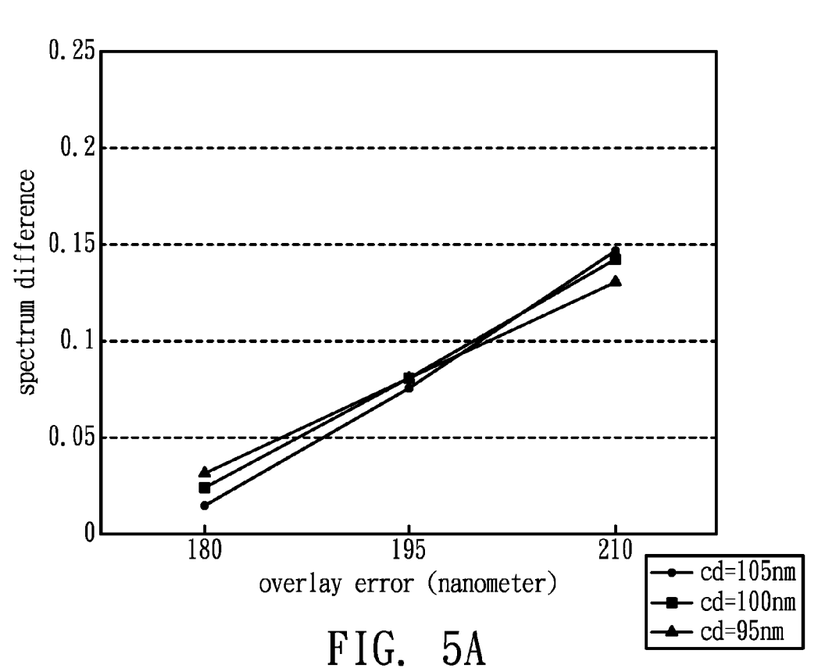
FIG. 5A-5D show diagrams of spectrum difference as a function of overlay error according to one embodiment of the present invention.
Figure 5B:
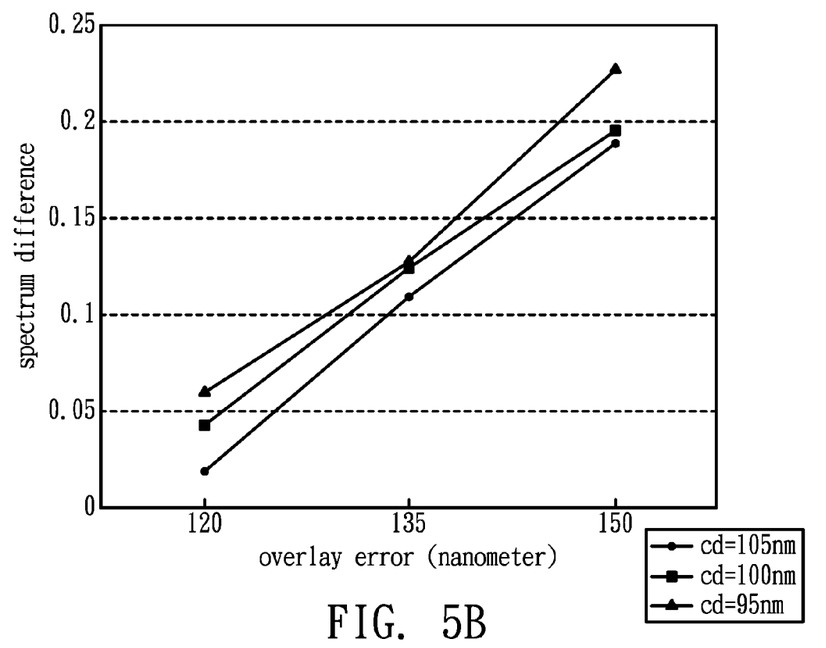
Figure 5C:
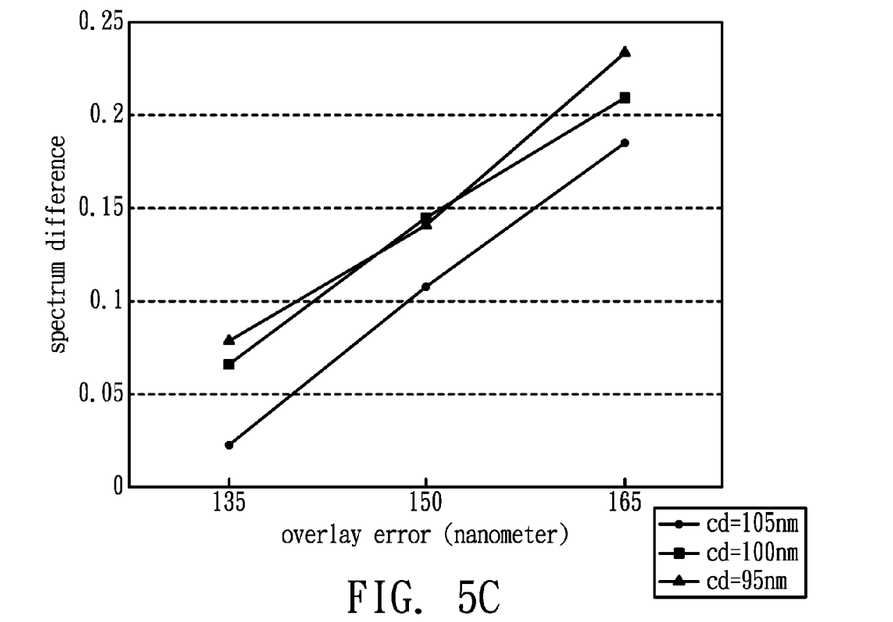
Figure 5D:
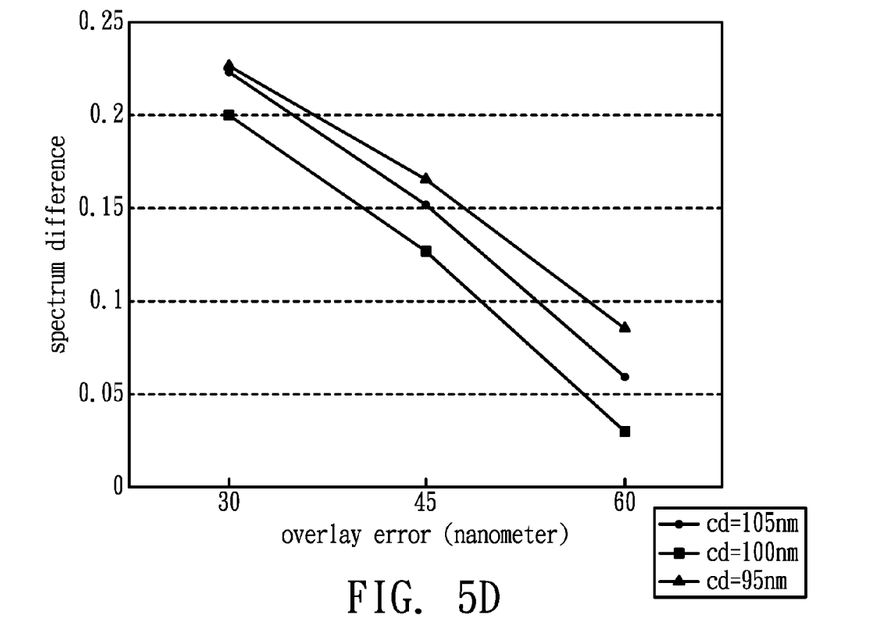

The spectrum difference curves of FIG. 4 can be obtained by changing the overlay error or offset of an overlay target pair. Each curve represents a function $y_i=f(cd_i, sa_i, d_i, \delta_i)$, which describes the deviation of the diffraction spectrum of the corresponding overlay target pair over the overlay error under the condition of fixed offset (δ). In order to make the most effective use of the information of FIG. 4, the segments of these curves where the slope changes abruptly are selected and analyzed in advance. For example, FIG. 4 shows that the curves have the steepest slopes when the error and offset (represented by (d, δ)) are (195, 60), (135, 150), (150, 135) and (270, 75), and the steepest slope physically means that the measurement of the corresponding overlay target pairs can be more sensitive or have higher diffraction efficiency. Thereafter, the objective overlay target having minimum structural parameter correlation is selected from the groups of the sensitive overlay target pairs, and the overlay target pair can be designed based on the structural parameters of the objective overlay target pair.

FIG. 5A-5D show diagrams of spectrum difference as a function of overlay error according to one embodiment of the present invention. The graphs of the spectrum difference shown in FIG. 5A-5D are generated by measuring the overlay targets wherein the (d, δ) values are (195, 60), (135, 150), (150, 135) and (270, 75), respectively. The effect of critical dimension of line width on the deviation of a simulated diffraction spectrum can be found from these graphs. In this embodiment, the objective overlay target pair is the overlay target of FIG. 5A, which has a line width of 100 nm, an overlay error of 195 nm and a shift of 60 nm. If the overlay target pattern of a wafer is designed by using the features of the objective overlay target pair, the overlay measurement will be more efficient and less influenced by structural parameters.

In addition, when a library stores the deviation data of the simulated diffraction spectrum and their corresponding structural parameters, the deviations of the simulated spectrum stored in the library can be used to match against the deviation of a measured diffraction spectrum of an overlay target. Then, the structural parameters of the measured overlay target can be found according to the structural parameters of the matched spectrum.

Figure 6:
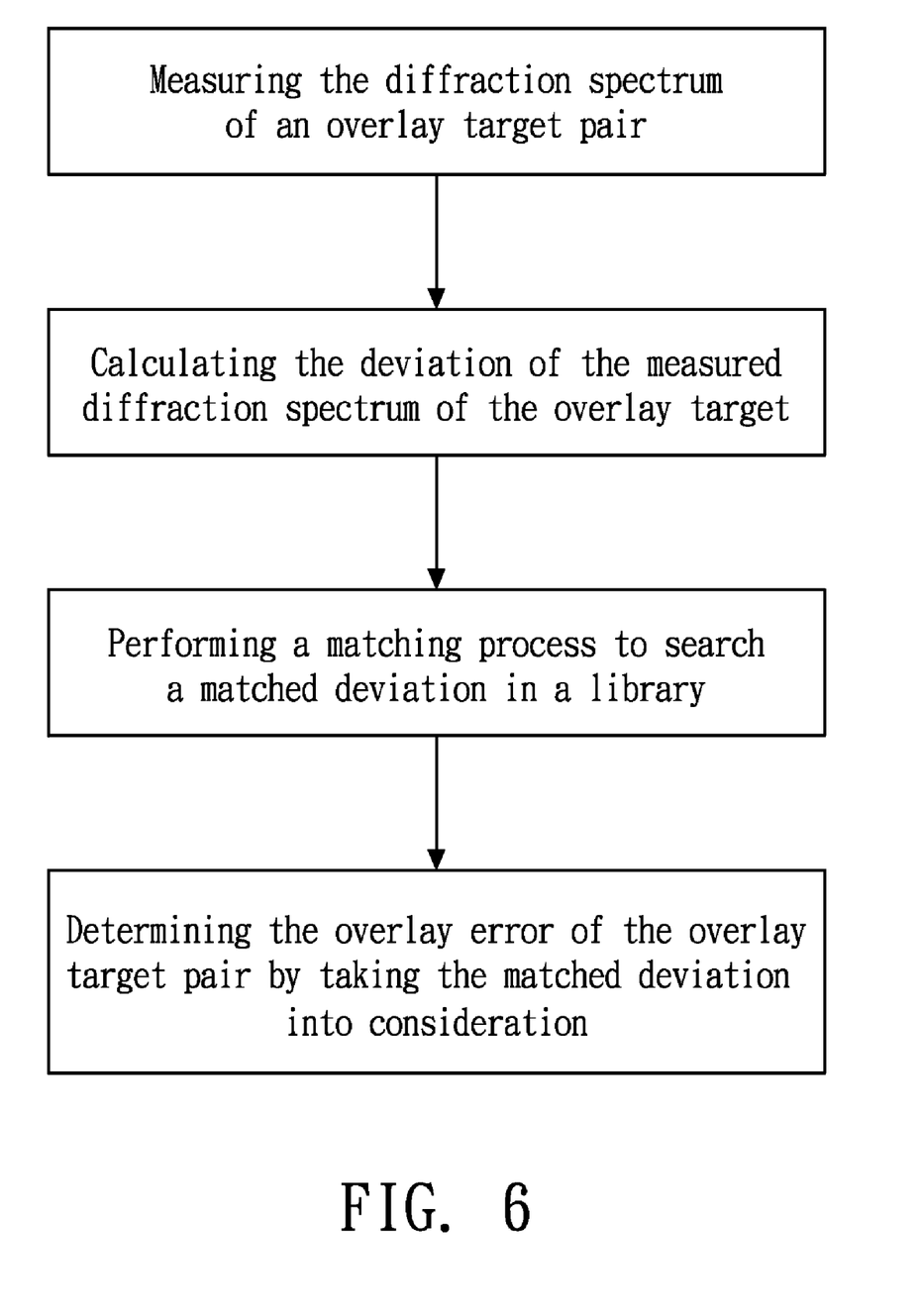
FIG. 6 illustrates a method of measuring an overlay error of an overlay target according to one embodiment of the present invention.
Figure 7:
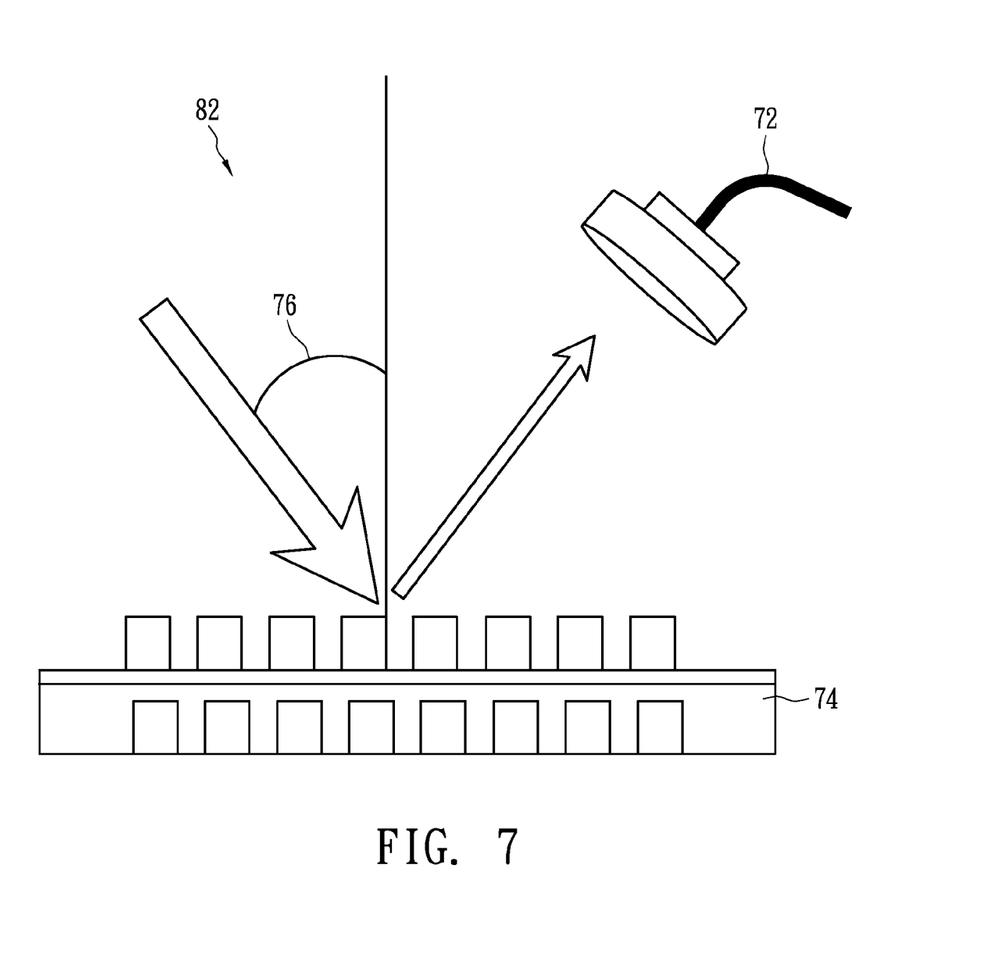
FIG. 7 illustrates an angular scatterometer according to one embodiment of the present invention.

FIG. 6 illustrates a method of measuring an overlay error of an overlay target according to one embodiment of the present invention. The diffraction spectrum of an overlay target pair is initially measured. The deviation of the measured diffraction spectrum of the overlay target is then calculated. The overlay target pair includes two overlay targets. Each overlay target comprises an upper grating layer, a medium layer, and a lower grating layer. The overlay targets have the same structural parameters except that the offsets between the upper layer and the lower layer are different. One has the offset of "d," and the other has "d+δ." A data-matching process is then performed. Next, a deviation of simulated diffraction spectrum of an overlay target pair matched to the deviation of the measured diffraction spectrum is found from a library. The library stores the deviations of multiple simulated diffraction spectra and the corresponding overlay errors thereof. Lastly, the error of the measured overlay target pair can be determined by the overlay target feature (or error) of the matched deviation of the simulated diffraction spectrum.

The method of setting up a library initially selects a plurality of overlay target pairs having different overlay errors or offsets. The deviation of the simulated diffraction spectrum formed by each overlay target pair is then calculated. Each overlay target pair includes a first overlay target and a second overlay target. The calculation method of the deviation of the simulated diffraction spectrum formed by each overlay target includes generating the simulated spectra of the first overlay target and the second overlay targets by using a spectrum simulation algorithm, and then calculating the deviations between the simulated spectra of the first and second overlay targets. The deviation can be a difference value, and the difference can be a root mean square error. The spectrum simulation algorithm applied to the simulation technique of the spectra of the first overlay target and the second overlay target includes rigorous coupled wave theory.

Figure 8:
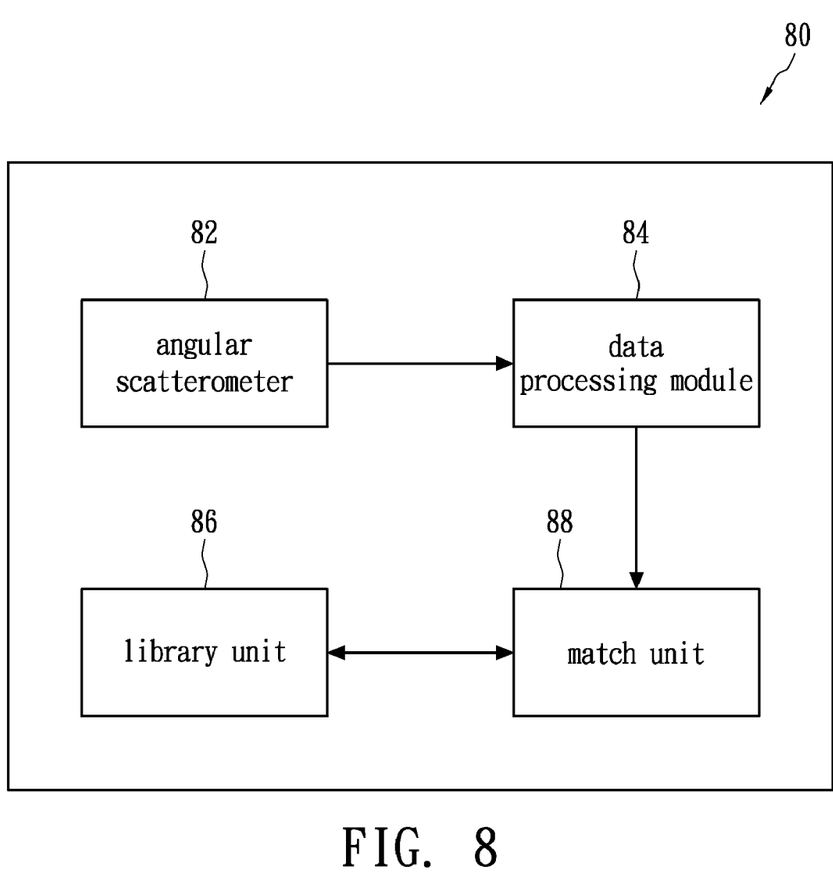
FIG. 8 illustrates a system for measuring overlay error according to one embodiment of the present invention.

FIG. 8 illustrates a system for measuring overlay error according to one embodiment of the present invention. The system 80 includes an angular scatterometer 82, a data processing module 84, a library unit 86 and a match unit 88. The library unit 86 is configured to store the deviations of simulated spectra and the corresponding overlay errors thereof. The angular scatterometer 82, illustrated in FIG. 7, includes a light source (not shown) directed to an overlay target pair 74 at a light incident angle 76, and a detector 72 for acquiring measured diffraction spectra. The two overlay targets of an overlay target pair have the same structural parameters but different offset values. The data processing module 84 is used to calculate the deviations of measured diffraction spectrum. The match unit 88 is configured to compare the deviation of a measured diffraction spectrum with the deviation data stored in a library, and then determines the structural parameters and the corresponding overlay error from the library according to the matched deviation data.

The library unit 86 is configured to set up the library. The library setup method initially selects a plurality of overlay target pairs having different overlay errors or offsets. The deviation of the simulated diffraction spectrum formed by each overlay target pair is then calculated. Each overlay target pair includes a first overlay target and a second overlay target. The calculation method of the deviation of the simulated diffraction spectrum formed by each overlay target includes simulating the spectra of the first and second overlay targets, and then calculating the deviations of the simulated spectra of the first and second overlay targets. The deviation can be a difference value, and the difference value can be a root mean squared error. The theory applied to simulation technique of the spectra of the first overlay target and the second overlay target includes rigorous coupled wave theory.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for measuring an overlay error, using a computer, comprising the steps of:
   measuring a diffraction spectrum of an overlay target pair;
   calculating a deviation of the measured diffraction spectrum of the overlay target pair;
   performing a matching process to search a matched deviation in a library, wherein the library stores a plurality of the deviations of the simulated diffraction spectra and corresponding overlay errors thereof; and
   determining the overlay error of the overlay target pair by taking the matched deviation into consideration.

2. The method of claim 1, wherein the overlay target pair comprises a first overlay target and a second overlay target, and the calculating step further comprises the steps of:
   generating measured spectra of the first overlay target and the second overlay target; and
   calculating the deviations of the measured spectra of the first and second overlay targets.

3. The method of claim 1, wherein the deviation is a difference value.

4. The method of claim 3, wherein the difference value is a root mean square error.

5. The method of claim 1, wherein the overlay target pair comprises a first overlay target and a second overlay target, the first overlay target has a predetermined overlay error, and the second overlay target has an error equal to the sum of the predetermined overlay error and the offset.

6. The method of claim 1, further comprising the step of defining the library, including:
   selecting a plurality of the overlay target pairs having different overlay errors or offsets; and
   calculating the deviation of the simulated diffraction spectrum for each overlay target pair.

7. The method of claim 6, wherein the overlay target pair comprises a first overlay target and a second overlay target, and the step of calculating the deviation further comprises the steps of:
   generating simulated spectra of the first and second overlay targets; and
   calculating the deviation between the simulated spectra of the first and second overlay targets.

8. The method of claim 7, wherein the deviation is a difference value.

9. The method of claim 8, wherein the difference value is a root mean square error.

10. The method of claim 7, wherein the step of generating simulated spectra of the first overlay target and the second overlay target is based on a rigorous coupled wave theory.

11. A system for measuring an overlay error, comprising:
    an angular scatterometer acquiring a measured spectrum of an overlay target pair;
    a data processing module calculating a deviation of the measured spectrum of each overlay target pair;
    a library unit storing the deviations of a plurality of simulated spectra and corresponding overlay errors thereof; and
    a match unit comparing the deviations of simulated diffraction spectra with the deviation of the measured diffraction spectrum of the overlay target pair so as to select an overlay error of the overlay target pair.

12. The system of claim 11, wherein the overlay target pair comprises a first overlay target and a second overlay target, the first overlay target has a predetermined overlay error, and the second overlay target has an error equal to the sum of the predetermined overlay error and an offset.

13. The system of claim 12, wherein the library unit further performs the steps of:
   generating simulated spectra of the first and second overlay targets by using a spectrum simulation algorithm; and
   calculating deviations of the simulated spectra of the first and second overlay targets.

14. The system of claim 13, wherein the overlay target pair comprises a first overlay target and a second overlay target and the library unit further performs the steps of:
   generating simulated spectra of the first and second overlay targets by using a spectrum simulation algorithm; and
   calculating deviations of the simulated spectra of the first and second overlay targets.

15. The system of claim 14, wherein the deviation is a difference value.

16. The system of claim 15, wherein the difference value is a root mean square error.

17. The system of claim 15, wherein the spectrum simulation algorithm is based on a rigorous coupled wave theory.

* * * * *